United States Patent
Tanji et al.

(10) Patent No.: US 8,575,992 B2
(45) Date of Patent: Nov. 5, 2013

(54) SWITCH

(75) Inventors: Kouki Tanji, Yokohama (JP); Eiichiro Otobe, Yokohama (JP)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 13/610,470

(22) Filed: Sep. 11, 2012

(65) Prior Publication Data

US 2013/0106495 A1 May 2, 2013

(30) Foreign Application Priority Data

Nov. 1, 2011 (JP) .................................. 2011-240564

(51) Int. Cl.
*H03K 17/60* (2006.01)

(52) U.S. Cl.
USPC ............................ 327/482; 327/344; 327/475

(58) Field of Classification Search
USPC ................................................ 327/365–508
See application file for complete search history.

(56) References Cited

U.S. PATENT DOCUMENTS

| | | | | |
|---|---|---|---|---|
| 8,368,451 | B2 * | 2/2013 | Mulawski et al. | 327/308 |
| 2010/0308892 | A1 * | 12/2010 | Sakakibara | 327/482 |
| 2011/0241755 | A1 * | 10/2011 | Mulawski et al. | 327/427 |

FOREIGN PATENT DOCUMENTS

JP 2006-279316 A 10/2006

* cited by examiner

*Primary Examiner* — Lincoln Donovan
*Assistant Examiner* — Brandon S Cole
(74) *Attorney, Agent, or Firm* — McDermott Will & Emery LLP

(57) ABSTRACT

A switch is capable of performing switching, while reducing distortion with respect to amplitude of a high frequency signal. The switch includes: an input terminal to which a high frequency signal is input; a first switching unit connected between the input terminal and a first output terminal and selectively outputting the high frequency signal through the first output terminal; and a second switching unit connected between the input terminal and a second output terminal and selectively outputting the high frequency signal through the second output terminal. Each switching unit includes an impedance transformer installed on a signal line, a bipolar transistor having an emitter grounded, a collector connected to the signal line, and a base receiving current according to a control voltage applied thereto; and a bipolar transistor having a collector grounded, an emitter connected to the signal line, and a base receiving current according to the control voltage.

3 Claims, 4 Drawing Sheets

SWITCH

CROSS-REFERENCE TO RELATED APPLICATIONS

This application claims the priority of Japanese Patent Application No. 2011-240564 filed on Nov. 1, 2011, in the Korean Intellectual Property Office, the disclosure of which is incorporated herein by reference.

BACKGROUND OF THE INVENTION

1. Field of the Invention

The present invention relates to a switch.

2. Description of the Related Art

As a switch for converting a path of a high frequency signal used in wireless communications, for example, a high electron mobility transistor (HEMT) of a GaAs based compound semiconductor is used. However, the price of a compound semiconductor wafer may be relatively high, and a large aperture of wafer thereof is currently not provided, and thus, it is disadvantageous in terms of price.

In addition, recently, in order to reduce the price of switches, for example, a complementary metal oxide semiconductor (CMOS) switch has been developed. A general CMOS (bulk CMOS) may cause power leakage due to a low-resistance substrate, and the switching characteristics thereof may be deteriorated. Accordingly, for example, when a CMOS switch is used, special processes using, for example, a silicon on sapphire (SOS) process or a silicon on insulator (SOI) process are used to improve switching characteristics. However, when special processes such as a SOS process, a SOI process or the like are used, manufacturing costs of the switch are increased.

Under these circumstances, technologies related to switches for converting a path of a high frequency signal have been developed. For example, Patent Document 1 discloses a technique related to switches using a heterojunction bipolar transistor (HBT).

For example, when a switch is formed using a bipolar transistor such as a heterojunction bipolar transistor (HBT) in which a general process such as a SiGe BiCMOS process, a combination of a SiGe HBT process and a bulk complementary metal oxide semiconductor (CMOS) process, is used, the costs of the switch may be reduced, as compared to when a switch is formed of a field effect transistor (FET) such as a high electron mobility transistor (HEMT). Here, as a FET has a symmetrical structure (that is, a structure in which a drain and a source are not fixed), the FET has the same characteristics when operating both in forward and reverse directions with respect to an amplitude of a high frequency signal. Meanwhile, in a bipolar transistor, operating characteristics in forward and reverse directions are not the same. Consequently, in a switch in which a bipolar transistor is used, distortion with respect to the amplitude of a high frequency signal may be generated.

For example, according to Patent Document 1, the characteristics of an HBT are improved, and thus there is a possibility of reducing distortion with respect to the amplitude of a high frequency signal. However, when using the technique disclosed in the Patent Document 1, a special process has to be used, and thus cost reduction cannot be expected.

[Related Art Document]

(Patent Document 1) Japanese Patent Laid-Open Publication No. 2006-279316

SUMMARY OF THE INVENTION

An aspect of the present invention provides a new and improved switch capable of performing switching, while reducing distortion with respect to an amplitude of a high frequency signal.

According to an aspect of the present invention, there is provided a switch including: an input terminal to which a high frequency signal is input; a first switching unit connected between the input terminal and a first output terminal from which the high frequency signal input to the input terminal is output, and selectively outputting the high frequency signal input to the input terminal through the first output terminal; and a second switching unit connected between the input terminal and a second output terminal from which the high frequency signal input to the input terminal is output, and selectively outputting the high frequency signal input to the input terminal through the second output terminal, wherein the first switching unit includes: a first impedance transformer installed on a first signal line between the input terminal and the first output terminal and transforming impedance; a first bipolar transistor having an emitter grounded, a collector connected to the first signal line, and a base receiving a current according to a first control voltage applied thereto, the first control voltage controlling a switching operation in the first switching unit; and a second bipolar transistor having a collector grounded, an emitter connected to the first signal line, and a base receiving the current according to the first control voltage applied thereto, and the second switching unit includes: a second impedance transformer installed on a second signal line between the input terminal and the second output terminal and transforming impedance; a third bipolar transistor having an emitter grounded, a collector connected to the second signal line, and a base receiving a current according to a second control voltage applied thereto, the second control voltage controlling a switching operation in the second switching unit; and a fourth bipolar transistor having a collector grounded, an emitter connected to the second signal line, and a base receiving the current according to the second control voltage applied thereto.

When a section between the input terminal and the output terminal is turned on, insertion loss between the input terminal and the output terminal may be reduced, and when a section between the input terminal and the output terminal is turned off, isolation between the input terminal and the output terminal may be increased. In addition, distortion with respect to an amplitude of a high frequency signal in each of the first switching unit and the second switching unit may be reduced. Thus, the switch may perform switching while reducing distortion with respect to the amplitude of the high frequency signal.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
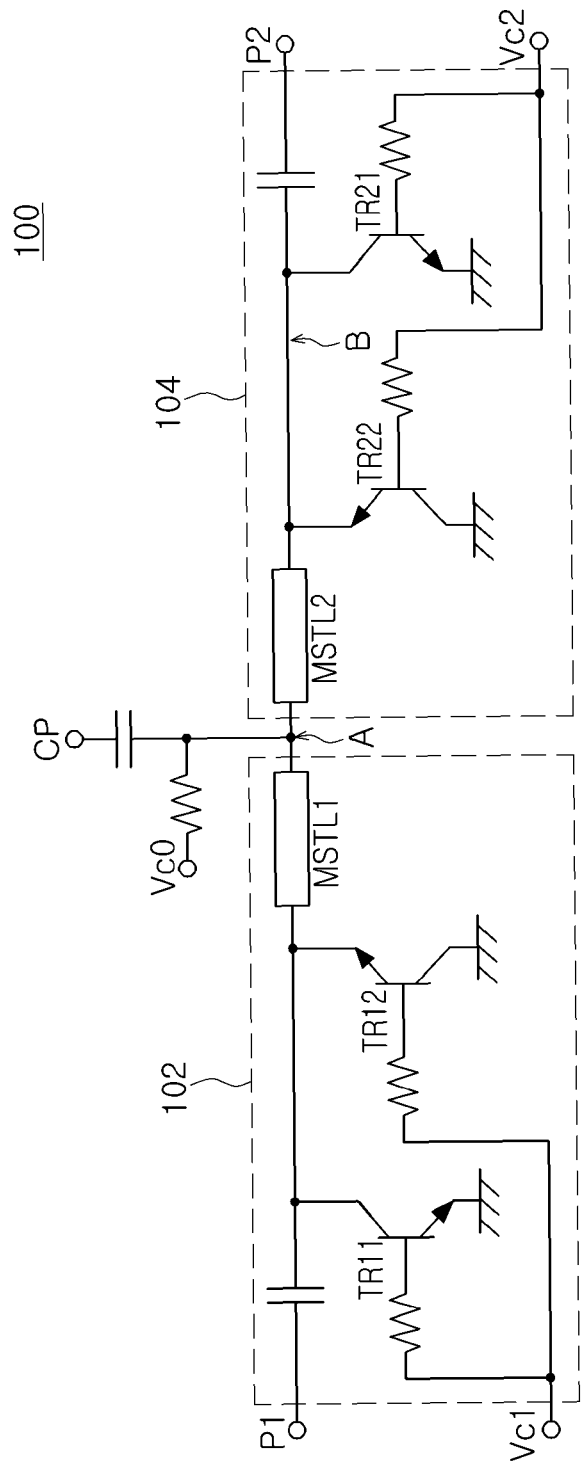
FIG. 1 is a schematic circuit diagram of a switch according to a first embodiment of the present invention.

Embodiments of the present invention will now be described in detail with reference to the accompanying drawings. Also, elements having the same functions and structures in the specification and the drawings will be denoted by the same reference numerals, and repeated descriptions thereof will be omitted.

Hereinafter, a single pole dual throw (SPDT) switch turned on or off via one input and two outputs will be described as a switch according to an embodiment of the present invention. In addition, while a SPDT switch having one input and two outputs is described for convenience of description, either terminal may be an input or an output. Also, the switch according to the embodiment of the present invention is not limited to being a SPDT switch. For example, a switch according to an embodiment of the present invention may be a single pole single throw (SPST) switch turned on or off via one input and one output or a switch turned on or off via one input and three or more outputs. A switch according to an embodiment of the present invention may be implemented as various switches including at least one first switching unit (or second switching unit) to be described later.

(First Embodiment)

FIG. 1 is a schematic circuit diagram illustrating a switch 100 according to a first embodiment of the present invention.

[1] Configuration of Switch 100

The switch 100 according to the embodiment of the present invention will hereinafter be described. The switch 100 includes an input terminal CP to which a high frequency signal is input, a first output terminal P1, a second output terminal P2, a first switching unit 102 connected between the input terminal CP and the first output terminal P1, and a second switching unit 104 connected between the input terminal CP and the second output terminal P2. The first switching unit 102 selectively outputs a high frequency signal input to the input terminal CP through the first output terminal P1. Also, the second switching unit 104 selectively outputs a high frequency signal input to the input terminal CP through the second output terminal P2.

Examples of a high frequency signal according to the embodiment of the present invention include frequency signals (e.g., 30 kHz to 300 GHz frequency signals) that are used in wireless communications such as a long wave signal, a medium wave signal, a shortwave signal, a very high frequency signal, an ultrahigh frequency signal, a microwave signal, and a millimeter-wave signal. Also, the high frequency signal according to the embodiment of the present invention is not limited thereto. For example, the high frequency signal according to the embodiment of the present invention may be a frequency signal lower than 30 kHz or a frequency signal higher than 300 GHz.

In the switch 100, the first switching unit 102 and the second switching unit 104 are turned on or off according to a voltage level (high level/low level) of control voltages Vc0, Vc1, and Vc2. In detail, for example, when a voltage level of the control voltage Vc0 is fixed at a high level, the first switching unit 102 is turned on when a voltage level of the control voltage Vc1 (first control voltage) is low, and is also turned on when the voltage level of the control voltage Vo1 is high. Also, for example, when the voltage level of the control voltage Vc0 is fixed at a high level, the second switching unit 104 is turned on when a voltage level of the control voltage Vc2 (second control voltage) is low, and is also turned on when the voltage level of the control voltage Vc2 is high.

The first switching unit 102 includes a first impedance transformer MSTL1, a first bipolar transistor TR11, and a second bipolar transistor TR12.

The first impedance transformer MSTL1 is installed on a first signal line between the input terminal CP and the first output terminal P1, and converts high resistance into low resistance, and low resistance into high resistance. Here, the first impedance transformer MSTL1 may be, for example, a ¼ wavelength path of a frequency used.

In the first bipolar transistor TR11, an emitter is grounded, a collector is connected to the first signal line, and a base receives a current according to the control voltage Vc1 applied thereto. Here, the first bipolar transistor TR11 may be a heterojunction bipolar transistor (HBT) using a general process such as a SiGe BiCMOS process, a combination of a SiGe HBT process and a bulk complementary metal oxide semiconductor (CMOS) process. Also, the first bipolar transistor TR11 according to the embodiment of the present invention is not limited to the HBT using the SiGe BiCMOS process.

In the second bipolar transistor TR12, a collector is grounded, an emitter is connected to a first signal line, and a base receives a current according to the control voltage Vc1 applied thereto. Here, like the first bipolar transistor TR11, the second bipolar transistor TR12 may be an HBT using a general process such as a SiGe BiCMOS process, a combination of a SiGe HBT process and a bulk CMOS process. Also, the second bipolar transistor TR12 according to the embodiment of the present invention is not limited to the HBT using the SiGe BiCMOS process.

The second switching unit 104 includes a second impedance transformer MSTL2, a third bipolar transistor TR21, and a fourth bipolar transistor TR22.

The second impedance transformer MSTL2 is installed on a second signal line between the input terminal CP and the second output terminal P2, and converts high resistance into low resistance, and low resistance into high resistance. Here, like the first impedance transformer MSTL1, the second impedance transformer MSTL2 may be, for example, a ¼ wavelength path of a frequency used.

In the third bipolar transistor TR21, an emitter is grounded, a collector is connected to the second signal line, and a base receives a current according to the control voltage Vc2 applied thereto. Here, the third bipolar transistor TR21 may be an HBT using a genera process such as a SiGe BiCMOS process, a combination of a SiGe HBT process and a bulk CMOS process. Also, the third bipolar transistor TR21 according to the embodiment of the present invention is not limited to the HBT using the SiGe BiCMOS process.

In the fourth bipolar transistor TR22, a collector is grounded, an emitter is connected to the second signal line, and a base receives a current according to the control voltage Vc2 applied thereto. Here, like the third bipolar transistor TR21, the fourth bipolar transistor TR22 may be an HBT using a general process such as a SiGe BiCMOS process, a combination of a SiGe HBT process and a bulk CMOS process. Also, the fourth bipolar transistor TR22 according to the embodiment of the present invention is not limited to the HBT using the SiGe BiCMOS process.

[2] Example of Switching Operation of Switch 100

Next, a switching operation of the switch 100 according to an embodiment of the present invention will be described. Here, it will be assumed that a section between the input terminal CP and the first output terminal P1 is in an on state, and a section between the input terminal CP and the second output terminal P2 is in an off state (that is, the first switching unit 102 is turned on, and the second switching unit 104 is turned off). In other words, hereinafter, an example, in which a voltage level of the control voltage Vc0 is high, a voltage level of the control voltage Vc1 is low, and a voltage level of the control voltage Vc2 is high, will be described. Meanwhile, as described above, in the case of setting the voltage level of the control voltage Vc1 to be high, and the voltage level of the control voltage Vc2 to be low, the first switching unit 102 is turned off, and the second switching unit 104 is turned on.

When the voltage level of the control voltage Vc1 is low, the first bipolar transistor TR11 and the second bipolar transistor TR12 are turned off, and thus insertion loss between the input terminal CP and the first output terminal P1 is reduced.

Meanwhile, when the voltage level of the control voltage Vc2 is low, the third bipolar transistor TR21 and the fourth bipolar transistor TR22 are turned on, and impedance at a point B of FIG. 1 is shorted from a ground. Accordingly, isolation between the input terminal CP and the second output terminal P2 increases.

Also, in the switch 100, due to an operation of the second impedance transformer MSTL2 included in the second switching unit 104 that is in the off state, a point A of FIG. 1, a connection point between the first switching unit 102 and the second switching unit 104 is in an open state. Consequently, an influence of the second switching unit 104 on insertion loss between the input terminal CP and the first output terminal P1 may be minimized.

The switch 100 conducts switching by, for example, as described above, reducing insertion loss of the first switching unit 102, which is in the on state, and increasing isolation of the second switching unit 104, which is in the off state.

As described above, the second switching unit 104, which is in the off state, allows impedance at the point B of FIG. 1 to be shorted from a ground, thereby increasing isolation between the input terminal CP and the second output terminal P2. Hereinafter, the functions of the third bipolar transistor TR21 and the fourth bipolar transistor TR22 in the second switching unit 104 will be described in detail.

At the point B of FIG. 1, a current of positive amplitude of a high frequency signal may flow by using the third bipolar transistor TR21, thereby being shorted. On the other hand, a current of negative amplitude of a high frequency signal may not flow in a direction from the emitter to the collector of the third bipolar transistor TR21, thereby failing to be shorted.

Also, a connection between the emitter and the collector of the fourth bipolar transistor TR22 of the second switching unit 104 is opposite to that of the third bipolar transistor TR21. Accordingly, a current of negative amplitude of a high frequency signal may flow by using the fourth bipolar transistor TR22 in the second switching unit 104, and thus a shorted state may be maintained.

Figure 2A:
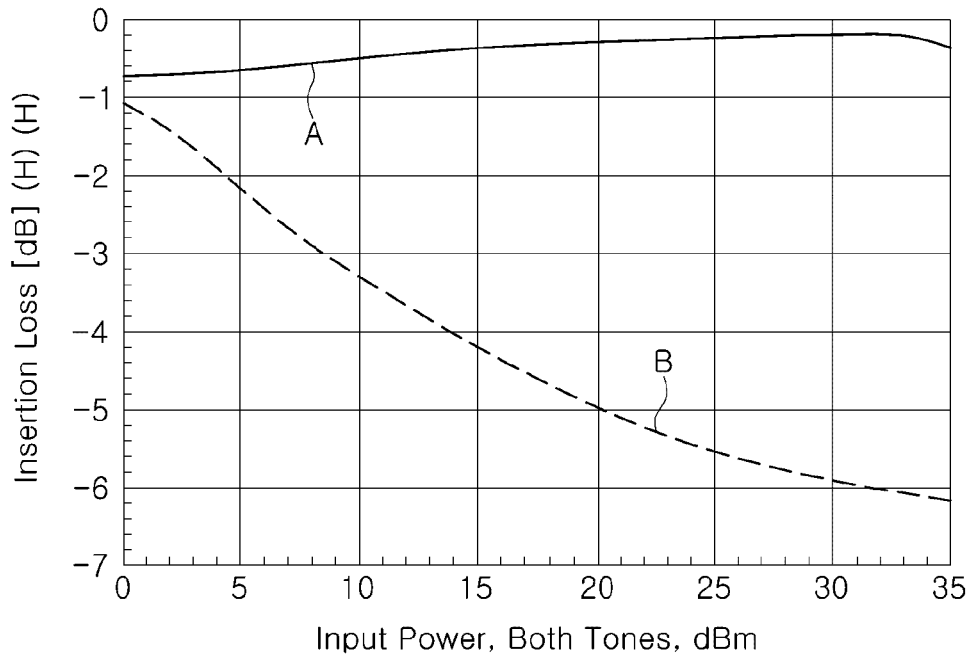
FIG. 2A is a graph showing an effect obtained by including a fourth bipolar transistor in the switch according to the first embodiment of the present invention.
Figure 2B:
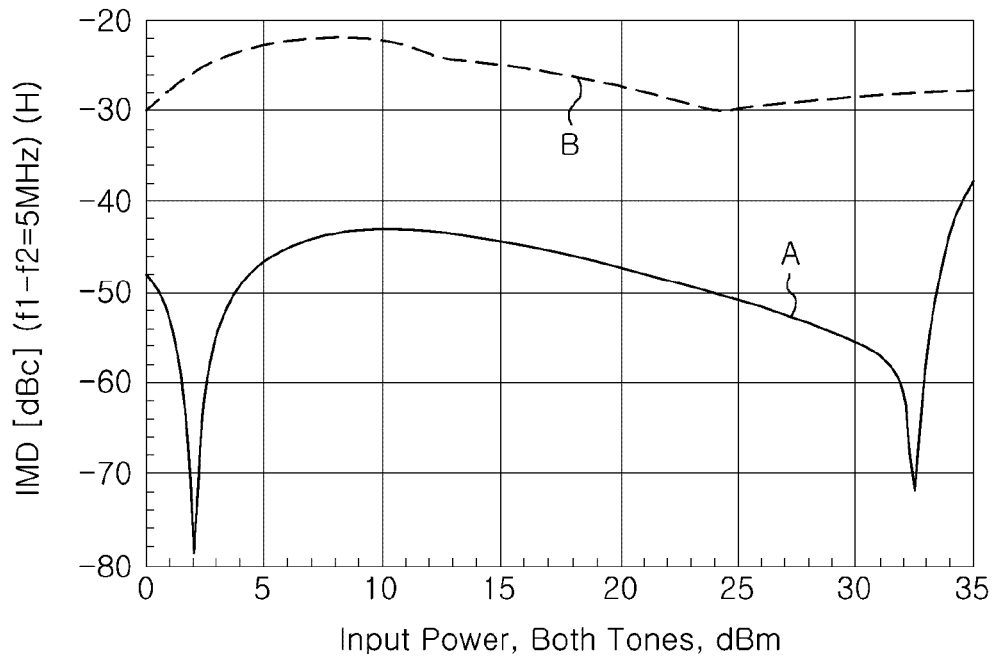
FIG. 2B is a graph showing an effect obtained by including a fourth bipolar transistor in the switch according to the first embodiment of the present invention.

FIGS. 2A and 2B are graphs for explaining the effect of including the fourth bipolar transistor TR22 according to the first embodiment of the present invention. FIG. 2A shows a relationship between insertion loss and high frequency signal power input between the input terminal CP and the first output terminal P1 in respective cases with and without the fourth bipolar transistor TR22. Also, FIG. 2B is a graph showing a relationship between inter modulation distortion (IMD) and high frequency signal power input between the input terminal CP and the first output terminal P1 in respective cases with and without the fourth bipolar transistor TR22. Here, curves A of FIGS. 2A and 2B denote cases in which the fourth bipolar transistor TR22 is included, and curves B of FIGS. 2A and 2B denote cases in which the fourth bipolar transistor TR22 is not included.

As shown in FIG. 2A, as the fourth bipolar transistor TR22 is included, insertion loss between the input terminal CP and the first output terminal P1 in the first switching unit 102 may be reduced compared to the case in which the fourth bipolar transistor TR22 is not included. Also, as shown in FIG. 2B, as the fourth bipolar transistor TR22 is included, IMD may be reduced in the first switching unit 102 compared to the case in which the fourth bipolar transistor TR22 is not included.

Also, although the description here focuses on the second switching unit 104, as illustrated in FIG. 1, the first switching unit 102 has the same configuration as that of the second switching unit 104. In other words, when the first switching unit 102 is turned off, the first bipolar transistor TR11 performs the same function as the third bipolar transistor TR21, and also, the second bipolar transistor TR12 performs the same function as the fourth bipolar transistor TR22.

Accordingly, the switch 100 according to the embodiment of the present invention configured as illustrated in FIG. 1 may conduct switching while reducing distortion with respect to an amplitude of a high frequency signal. Also, the switch 100 configured as illustrated in FIG. 1 may reduce distortion even when a high frequency signal is a large power signal.

In addition, the switch 100 may achieve reduction in distortion and perform switching using HBTs using a general process such as a SiGe BiCMOS process, a combination of a SiGe HBT process and a bulk CMOS process, as the first bipolar transistor TR11, the second bipolar transistor TR12, the third bipolar transistor TR21, and the fourth bipolar transistor TR22. That is, there is no need to use a special process in the switch 100.

Accordingly, the switch 100 according to the first embodiment of the present invention may achieve reduction in manufacturing costs.

(Second Embodiment)

Figure 3:
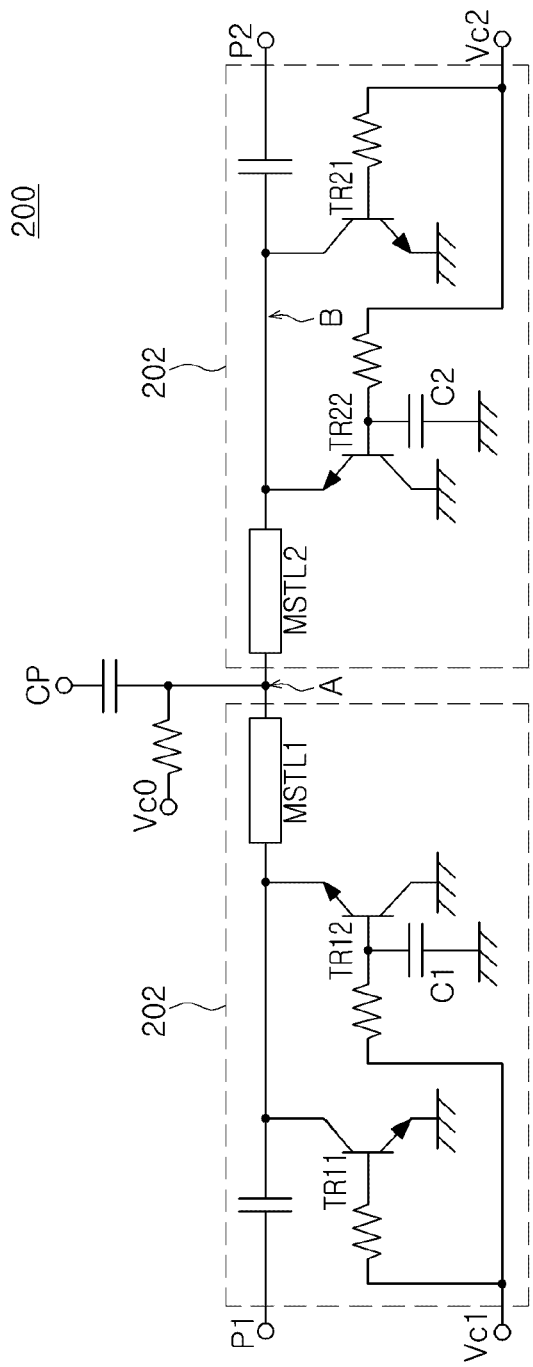
FIG. 3 is a schematic circuit diagram of a switch according to a second embodiment of the present invention.

A configuration of a switch according to an embodiment of the present invention is not limited to FIG. 1. FIG. 3 is a schematic view of a switch 200 according to another embodiment of the present invention.

The switch 200 includes an input terminal CP to which a high frequency signal is input, a first output terminal P1, a second output terminal P2, a first switching unit 202 connected between the input terminal CP and the first output terminal P1, and a second switching unit 204 connected between the input terminal CP and the second output terminal P2. Like the first switching unit 102 illustrated in FIG. 1, the first switching unit 202 selectively outputs a high frequency signal input to the input terminal CP through the first output terminal P1. Also, like the second switching unit 104 illustrated in FIG. 1, the second switching unit 204 selectively outputs a high frequency signal input to the input terminal CP through the second output terminal P2.

Here, when comparing the first switching unit 202 with the first switching unit 102 illustrated in FIG. 1, the first switching unit 202 basically has the same configuration as that of the first switching unit 102 illustrated in FIG. 1 except for the inclusion of a capacitor C1 of which one end is connected to a base of the second bipolar transistor TR12 and the other end is grounded. Also, when comparing the second switching unit 204 with the second switching unit 104 illustrated in FIG. 1, the second switching unit 204 basically has the same configuration as that of the second switching unit 104 illustrated in FIG. 1 except for the inclusion of a capacitor C2 of which one end is connected to a base of the fourth bipolar transistor TR22 and the other end is grounded.

The capacitor C1 reduces a possibility of an increase in insertion loss between the input terminal CP and the first output terminal P1 and distortion when the first switching unit 202 is in an on state (that is, when the first bipolar transistor TR11 and the second bipolar transistor TR12 are turned off). Also, the capacitor C2 reduces a possibility of an increase in insertion loss between the input terminal CP and the second output terminal P2 and distortion when the second switching unit 204 is in anon state (that is, when the third bipolar transistor TR21 and the fourth bipolar transistor TR22 are turned off).

In detail, for example, when a section between the input terminal CP and the first output terminal P1 is in an on state, the second bipolar transistor TR12 is required to maintain an off state. However, for example, when a high frequency signal input from the input terminal CP is a large power signal, high frequency amplitude may be linked to the base of the second bipolar transistor TR12, and as a result, the second bipolar transistor TR12 may fail to maintain the off state.

The switch 200 includes the capacitor C1 having one end connected to the base of the second bipolar transistor TR12 and the other end grounded, thereby stabilizing a potential of the base of the second bipolar transistor TR12 with respect to the high frequency amplitude and preventing the second bipolar transistor TR12 from failing to maintain the off state. Here, a capacity of the capacitor C1 may be, for example, a capacity at which a short circuit is caused at a high frequency. In detail, the capacity of the capacitor C1 may be, for example, a capacity of about 2 pF with respect to a frequency of 1 GHz. Also, the capacity of the capacitor C1 according to the embodiment of the present invention is not limited thereto.

Figure 4A:
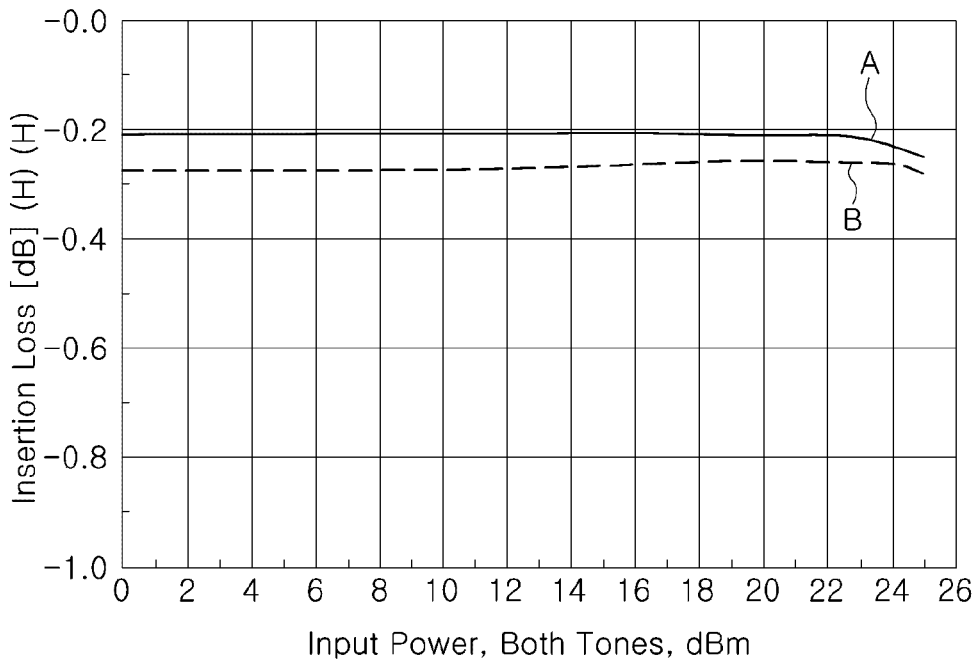
FIG. 4A is a graph showing an effect obtained by including a capacitor in the switch according to the second embodiment of the present invention.
Figure 4B:
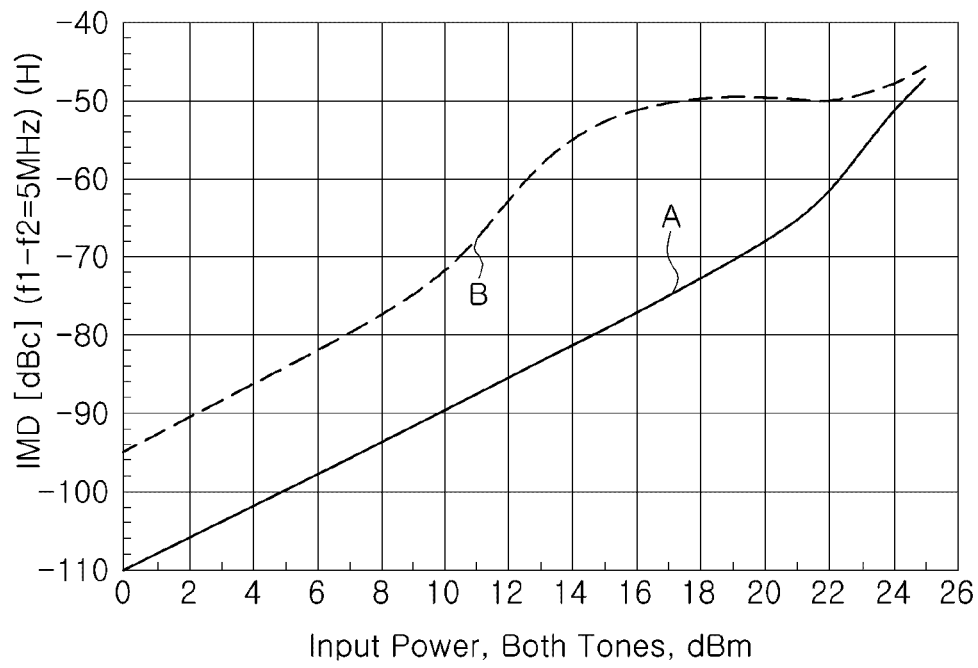
FIG. 4B is a graph showing an effect obtained by including a capacitor in the switch according to the second embodiment of the present invention.

FIGS. 4A and 4B are graphs for explaining the effect of including the capacitor C1 according to the second embodiment of the present invention. FIG. 4A shows a relationship between insertion loss and high frequency signal power input between the input terminal CP and the first output terminal P1 in respective cases with and without the capacitor C1. Also, FIG. 4B is a graph showing a relationship between IMD and high frequency signal power input between the input terminal CP and the first output terminal P1 in respective cases with and without the capacitor C1. Here, curves A of FIGS. 4A and 4B denote cases in which the capacitor C1 is included, and curves B of FIGS. 4A and 4B denote cases in which the capacitor C1 is not included.

As shown in FIG. 4A, by including the capacitor C1, insertion loss between the input terminal CP and the first output terminal P1 in the first switching unit 202 may be reduced compared to the case in which the capacitor C1 is not included. Also, as shown in FIG. 4B, by including the capacitor C1, IMD may be reduced in the first switching unit 202, compared to the case in which the capacitor C1 is not included.

Further, while the description here focuses on the first switching unit 202, as illustrated in FIG. 3, the second switching unit 204 has the same configuration as that of the first switching unit 202. In other words, when the second switching unit 204 is turned on, the capacitor C2 performs the same function as the capacitor C1.

Accordingly, the switch 200 according to the second embodiment of the present invention configured as illustrated in FIG. 3 may conduct switching while reducing distortion with respect to an amplitude of a high frequency signal at a level greater than that of the switch 100 according to the first embodiment illustrated in FIG. 1. Also, the switch 200 configured as illustrated in FIG. 3 may reduce distortion even when a high frequency signal is a large power signal.

In addition, like the switch 100 according to the embodiment illustrated in FIG. 1, the switch 200 may achieve reduction in distortion and perform switching using HBTs using a general process such as a SiGe BiCMOS process, a combination of a SiGe HBT process and a bulk CMOS process, as the first bipolar transistor TR11, the second bipolar transistor TR12, the third bipolar transistor TR21, and the fourth bipolar transistor TR22. That is, like the switch 100 illustrated in FIG. 1, there is no need to use a special process in the switch 200.

Accordingly, like the switch 100 according to the embodiment of FIG. 1, the switch 200 according to the current embodiment of the present invention may achieve reduction in manufacturing costs.

Also, the configuration of the switch 200 according to the second embodiment of the present invention is not limited as illustrated in FIG. 3. For example, while the first switching unit 202 and the second switching unit 204 in FIG. 3 include the capacitor C1 and the capacitor C2, respectively, either the first switching unit 202 or the second switching unit 204 may include a capacitor. Even in this configuration, the switch 200 according to this modified embodiment may exhibit an effect equal to or greater than that of the switch 100 according to the embodiment of FIG. 1.

For example, a switch according to embodiments of the present invention may be formed as a circuit equivalent to the switch 100 illustrated in FIG. 1 or the switch 200 illustrated in FIG. 3 (including switches according to modified examples), or the like.

As set forth above, according to embodiments of the present invention, a switch may perform switching while reducing distortion with respect to an amplitude of a high frequency signal.

While the present invention has been shown and described in connection with the exemplary embodiments, it will be apparent to those skilled in the art that modifications and variations can be made without departing from the spirit and scope of the invention as defined by the appended claims.

What is claimed is:
1. A switch comprising:
an input terminal to which a high frequency signal is input;
a first switching unit connected between the input terminal and a first output terminal from which the high frequency signal input to the input terminal is output, and selectively outputting the high frequency signal input to the input terminal through the first output terminal; and
a second switching unit connected between the input terminal and a second output terminal from which the high frequency signal input to the input terminal is output, and selectively outputting the high frequency signal input to the input terminal through the second output terminal,
wherein the first switching unit includes:
a first impedance transformer installed on a first signal line between the input terminal and the first output terminal and transforming impedance;
a first bipolar transistor having an emitter grounded, a collector connected to the first signal line, and a base receiving a current according to a first control voltage applied thereto, the first control voltage controlling a switching operation in the first switching unit; and
a second bipolar transistor having a collector grounded, an emitter connected to the first signal line, and a base receiving the current according to the first control voltage applied thereto, and the second switching unit includes:
a second impedance transformer installed on a second signal line between the input terminal and the second output terminal and transforming impedance;
a third bipolar transistor having an emitter grounded, a collector connected to the second signal line, and a base receiving a current according to a second control voltage applied thereto, the second control voltage controlling a switching operation in the second switching unit; and
a fourth bipolar transistor having a collector grounded, an emitter connected to the second signal line, and a base receiving the current according to the second control voltage applied thereto.

2. The switch of claim 1, wherein the first switching unit further includes a capacitor of which one end is connected to the base of the second bipolar transistor and the other end is grounded.

3. The switch of claim 1, wherein the second switching unit further includes a capacitor of which one end is connected to the base of the fourth bipolar transistor and the other end is grounded.

\* \* \* \* \*